(12) United States Patent
Parker et al.

(10) Patent No.: US 8,384,452 B1
(45) Date of Patent: Feb. 26, 2013

(54) INTEGRATED JITTER COMPLIANT LOW BANDWIDTH PHASE LOCKED LOOPS

(75) Inventors: Kevin Parker, Nepean (CA); Malcolm Stevens, North Gower (CA); Stephane Dallaire, Gatineau (CA); Shawn Scouten, Kanata (CA); Jeff P. Kirsten, Folsom, CA (US)

(73) Assignee: Cortina Systems, Inc., Sunnyvale, CA (US)

( * ) Notice: Subject to any disclaimer, the term of this patent is extended or adjusted under 35 U.S.C. 154(b) by 0 days.

(21) Appl. No.: 13/231,798

(22) Filed: Sep. 13, 2011

(51) Int. Cl.
*H03L 7/06* (2006.01)
(52) U.S. Cl. .......................................... 327/156; 327/147
(58) Field of Classification Search .................. 327/147, 327/156
See application file for complete search history.

(56) References Cited

U.S. PATENT DOCUMENTS

| | | | |
|---|---|---|---|
| 7,365,607 B2 * | 4/2008 | Fahim | 331/1 A |
| 2009/0256601 A1 * | 10/2009 | Zhang et al. | 327/156 |
| 2011/0063003 A1 * | 3/2011 | Friedman et al. | 327/157 |
| 2011/0169578 A1 * | 7/2011 | Lucas et al. | 331/25 |
| 2011/0204944 A1 * | 8/2011 | Lee et al. | 327/159 |
| 2011/0234270 A1 * | 9/2011 | Kobayashi | 327/156 |
| 2011/0273210 A1 * | 11/2011 | Nagaraj | 327/159 |
| 2012/0062289 A1 * | 3/2012 | Suzuki et al. | 327/156 |

* cited by examiner

*Primary Examiner* — Adam Houston

(57) ABSTRACT

A phase difference between a reference clock signal and a feedback signal is digitally detected. A resultant phase detection signal is digitally filtered, and a PLL (Phase Locked Loop) output signal is synthesized in a fractional synthesizer under control of the digitally filtered phase detection signal. A feedback path, which could include an integer divider and/or a fractional N divider, provides the feedback signal based on the PLL output signal. The combination of a wide bandwidth fractional synthesizer and a low bandwidth digital PLL provides for a low bandwidth jitter filtering function with a wide bandwidth PLL to suppress VCO (Voltage Controlled Oscillator) noise and crosstalk.

21 Claims, 14 Drawing Sheets

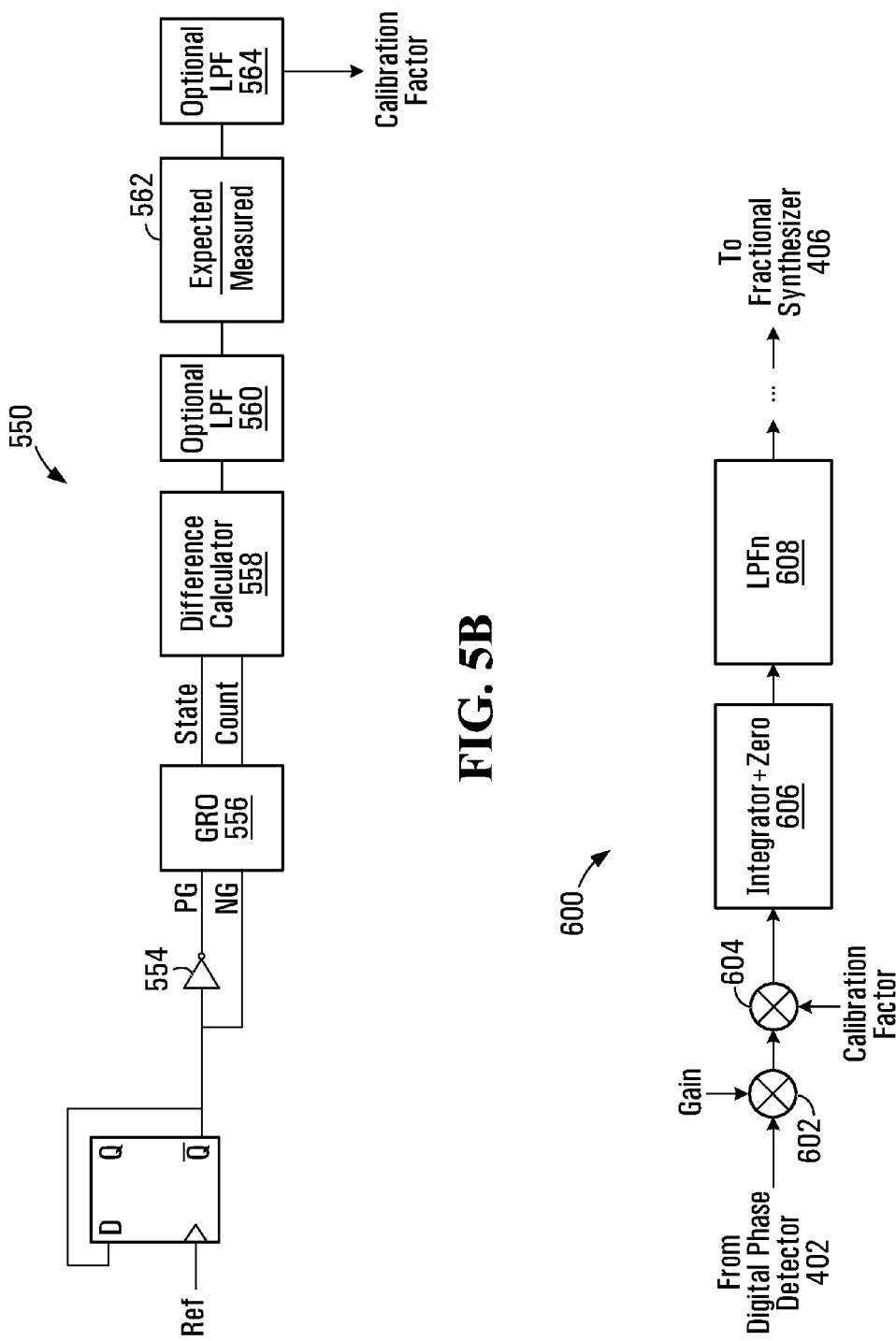

INTEGRATED JITTER COMPLIANT LOW BANDWIDTH PHASE LOCKED LOOPS

FIELD OF THE INVENTION

This invention relates generally to clock signal generation and, in particular, to integration of multiple low bandwidth PLLs (Phase Locked Loops).

BACKGROUND

Crosstalk between adjacent clock signal generators can cause noise and/or other effects within a frequency band of interest. For example, crosstalk between oscillators in different PLLs may produce noise in clock signals generated by those PLLs. In order to meet performance specifications in SONET (Synchronous Optical Network), OTN (Optical Transport Network), and other types of communication systems, very low bandwidth cleanup PLLs might be preferred to remove noise from recovered or mapped/demapped clock signals. However, such low bandwidth cleanup PLLs can exhibit poor crosstalk immunity. Wider bandwidth might reduce crosstalk, but at the cost of reduced reference noise filtering and such effects as clock signal jitter.

Consider an illustrative example of a jitter transfer specification having a 300 Hz pole. An actual implementation that satisfies such a specification might require a filter or filtering function with a 100 Hz pole. This would not be feasible for integrated analog filters, for instance, in many applications due to the large size of the capacitors in such filters. Other implementations might include very clean but costly VCXOs (Voltage Controlled Crystal Oscillators), or stand-alone cleanup PLLs. Although stand-alone PLLs could be displaced from each other to reduce crosstalk, the cost associated with providing external cleanup PLLs tends to be much greater than the cost of integrating multiple PLLs on the same chip or board or in the same package as other components. Providing space between PLLs also consumes "real estate", which could be limited in a chip, in a package, or on a board, especially in applications that include multiple cleanup PLLs. A PLL with a conventional integrated VCO (Voltage Controlled Oscillator) needs a wide bandwidth to suppress the noise of the VCO. Without this wide bandwidth, low noise requirements placed on the VCO would require it to draw excessive power, to the point of being unrealizable.

BRIEF DESCRIPTION OF THE DRAWINGS

Examples of embodiments of the invention will now be described in greater detail with reference to the accompanying drawings.

FIG. 5B is a block diagram of an example inverter delay calibration system.
FIG. 6 is a block diagram of an example digital loop filter.

DETAILED DESCRIPTION

Implementing a PLL using a DCO (Digital Controlled Oscillator), with a low bandwidth digital filter and a phase (time) to digital converter, allows the integration of a very low bandwidth PLL. A very low bandwidth analog filter would require excessively large components, specifically very large capacitors that would prohibit integration due to their physical size, or very large resistors that would cause a noise (jitter) problem. In a digital filter, a lower bandwidth can be achieved by increasing the number of bits in the filter. As digital feature sizes shrink, the size of such a digital filter will be reduced. The size of an analog filter does not scale in the same manner.

If the DCO is implemented with a fractional synthesizer such as a fractional N PLL, then the bandwidth of the fractional N PLL loop can be made large to reduce the noise of the VCO in that loop. This wide fractional-N PLL bandwidth also helps to reject cross-talk between VCOs in different PLLs.

The combination of the fractional synthesizer with a wide bandwidth and a digital PLL with a low bandwidth allows for a low bandwidth jitter filtering function with a wide bandwidth PLL to suppress VCO noise and crosstalk.

These measures might allow cleanup PLLs to be integrated into a system chip or package or onto the same board as other components, for example. Such integration can reduce chip, package, and/or board cost, complexity, and area relative to conventional designs.

Figure 1:
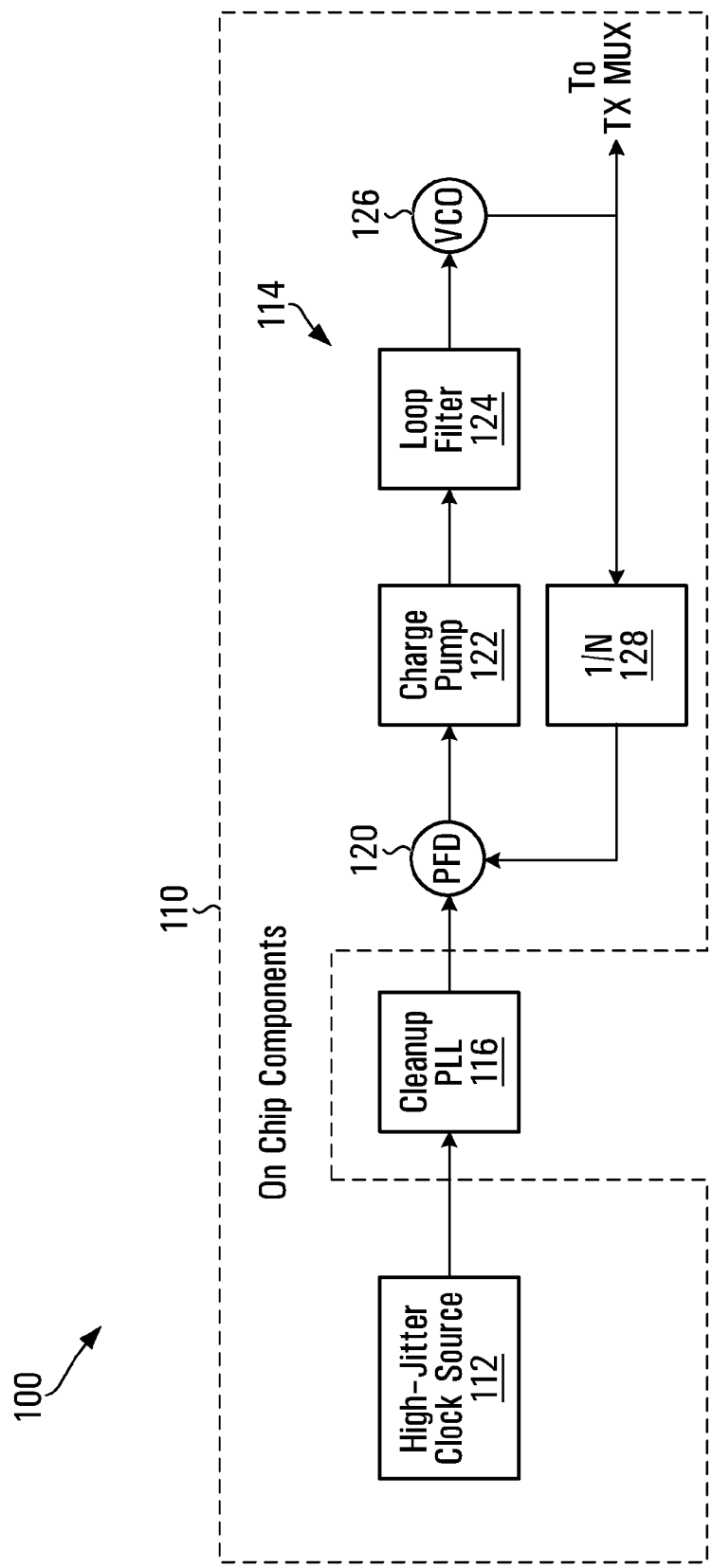
FIG. 1 is a block diagram of an example chip layout.

FIG. 1 is a block diagram of an example chip layout. The example chip layout 100 includes a chip generally designated 110, a high-jitter clock source 112 and a PLL 114 on the chip, and an off-chip cleanup PLL 116. The on-chip PLL 114 is a transmit PLL which provides a clock signal to a transmit multiplexer in the example shown. The transmit PLL 114 includes a phase detector 120, a charge pump 122, a loop filter 124, a Voltage Controlled Oscillator (VCO) 126, and a divider 128. The cleanup PLL 116, which may have the same structure as the transmit PLL 114, cleans a clock signal that is provided by the high-jitter clock source 112, and provides a cleaned clock signal to the phase detector 120 of the transmit PLL 114 as a reference clock signal. Due to crosstalk effects, chip size or area constraints, and/or other issues, the cleanup PLL 116 is located off-chip, and might even be sourced separately from the chip 110.

It should be appreciated that the example chip layout 100 of FIG. 1, as well as the contents of the other drawings, are intended solely for illustrative purposes, and that the present disclosure is in no way limited to the particular examples explicitly shown in the drawings. For example, a clock signal that is cleaned by a cleanup PLL could be provided by any of various types of high-jitter clock sources. In one embodiment, the high-jitter clock source 112 is a recovered clock that is passed through a clock mapping function, although other clock sources are contemplated. Also, an electronic device or equipment often includes multiple cleanup PLLs 116, and possibly multiple transmit PLLs and/or other components that use cleaned clock signals. Clock signals that are provided by a low bandwidth cleanup or jitter-attenuation PLL as disclosed herein could be used by components other than transmit PLLs or multiplexers, which are intended as non-limiting examples of components to which output clock signals could be supplied.

Figure 2:
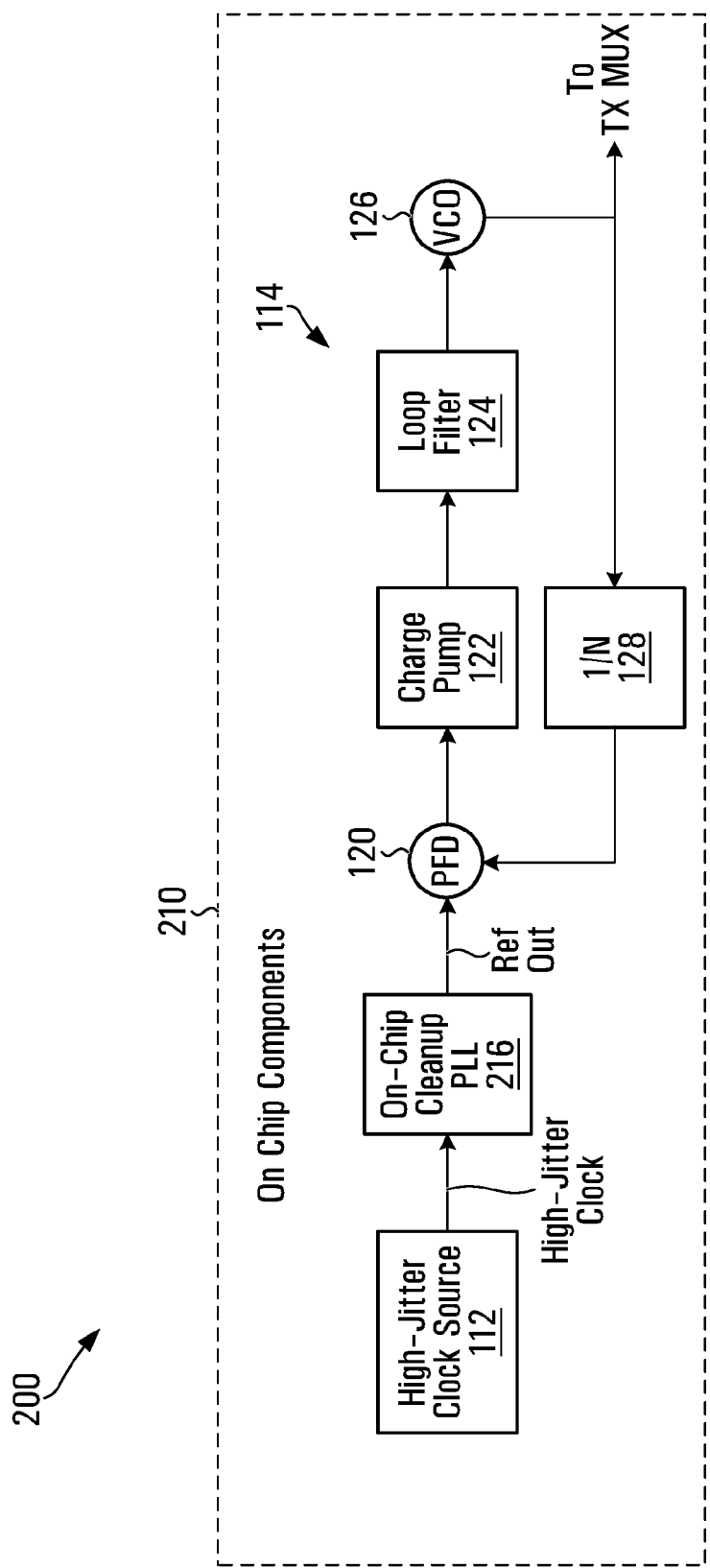
FIG. 2 is a block diagram of an example chip layout with an integrated cleanup PLL.

FIG. 2 is a block diagram of an example chip layout with an integrated cleanup PLL. The example chip layout 200 is similar to the chip layout 100 in FIG. 1, with the exception that the chip 210 includes an integrated on-chip cleanup PLL 216.

Figure 3:
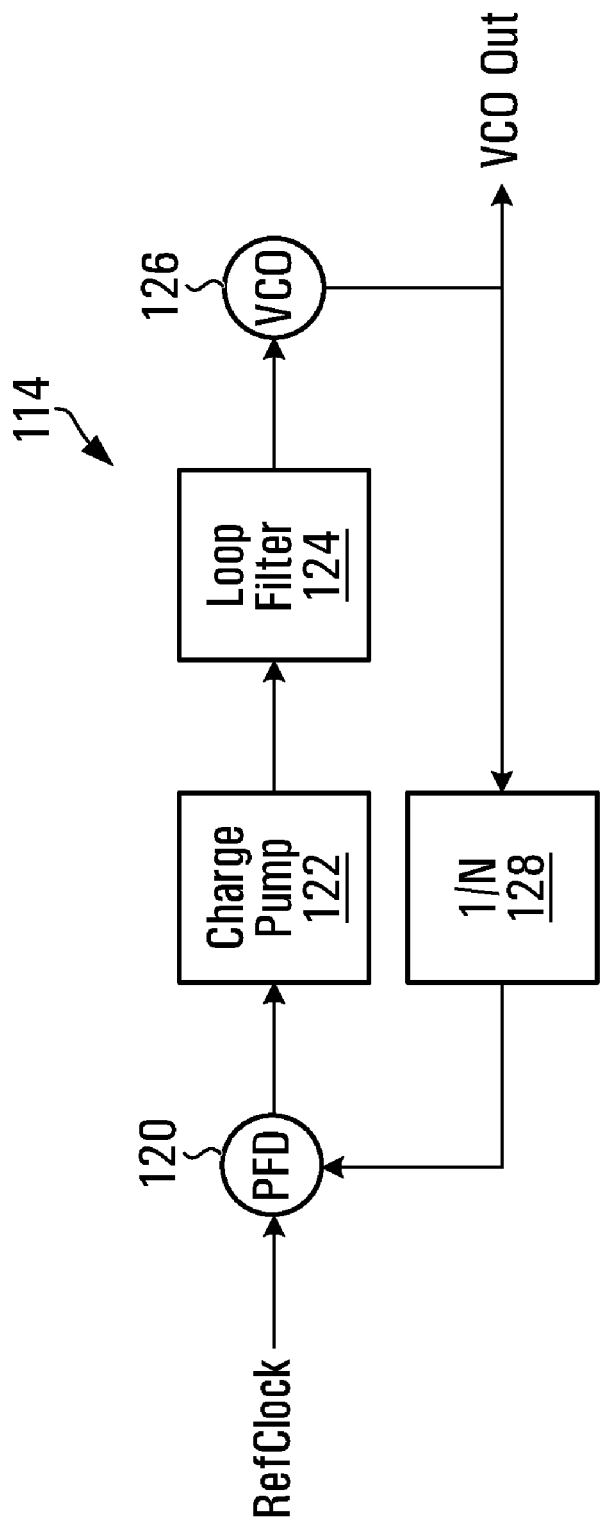
FIG. 3 is a block diagram of an example PLL.

FIG. 3 is a block diagram of an example PLL. Although FIG. 3 shows the PLL 114 as an example, the cleanup PLL 116 in FIG. 1 might have the same structure. As noted above, the transmit PLL 114 includes a phase detector 120, a charge pump 122, a loop filter 124, a VCO 126, and a divider 128. The frequency of the PLL output signal VCO Out from the VCO 126 is dependent on the frequency of the reference clock signal RefClock provided to the phase detector 120 and the division factor or modulus applied by the divider 128. In general, $$f_{out} = N \times f_{ref}$$

where $f_{out}$ is the frequency of the output signal from the VCO 126;
N is the division factor or modulus applied by the divider 128; and
$f_{ref}$ is the frequency of the reference clock signal RefClock.

N could be a fixed integer or, in a fractional N PLL, N is switched between multiple integers to effectively provide a fractional division factor. A fractional division factor could be provided, for example, by cascading a fractional N divider with an integer divider in a PLL feedback path. In any of the example PLLs disclosed herein, a feedback path divider, if provided, could implement an integer division factor or a fractional division factor, using one integer or fractional N divider or a cascade of a fractional N divider with an integer divider, for instance.

In conventional PLL designs, crosstalk between VCOs 126 in different PLLs can be problematic. As noted above, wide-bandwidth PLLs can reduce crosstalk between the PLL VCOs 126, but at the cost of reference noise filtering. Low bandwidth PLLs have good reference noise filtering but have poor VCO noise and crosstalk performance. Also low-bandwidth analog loop filters require large capacitors and therefore might not be suitable for at least certain implementations. The present disclosure provides example PLL implementations which exhibit both wide bandwidth for noise and crosstalk suppression and low bandwidth for reference noise filtering at the same time.

Figure 4:
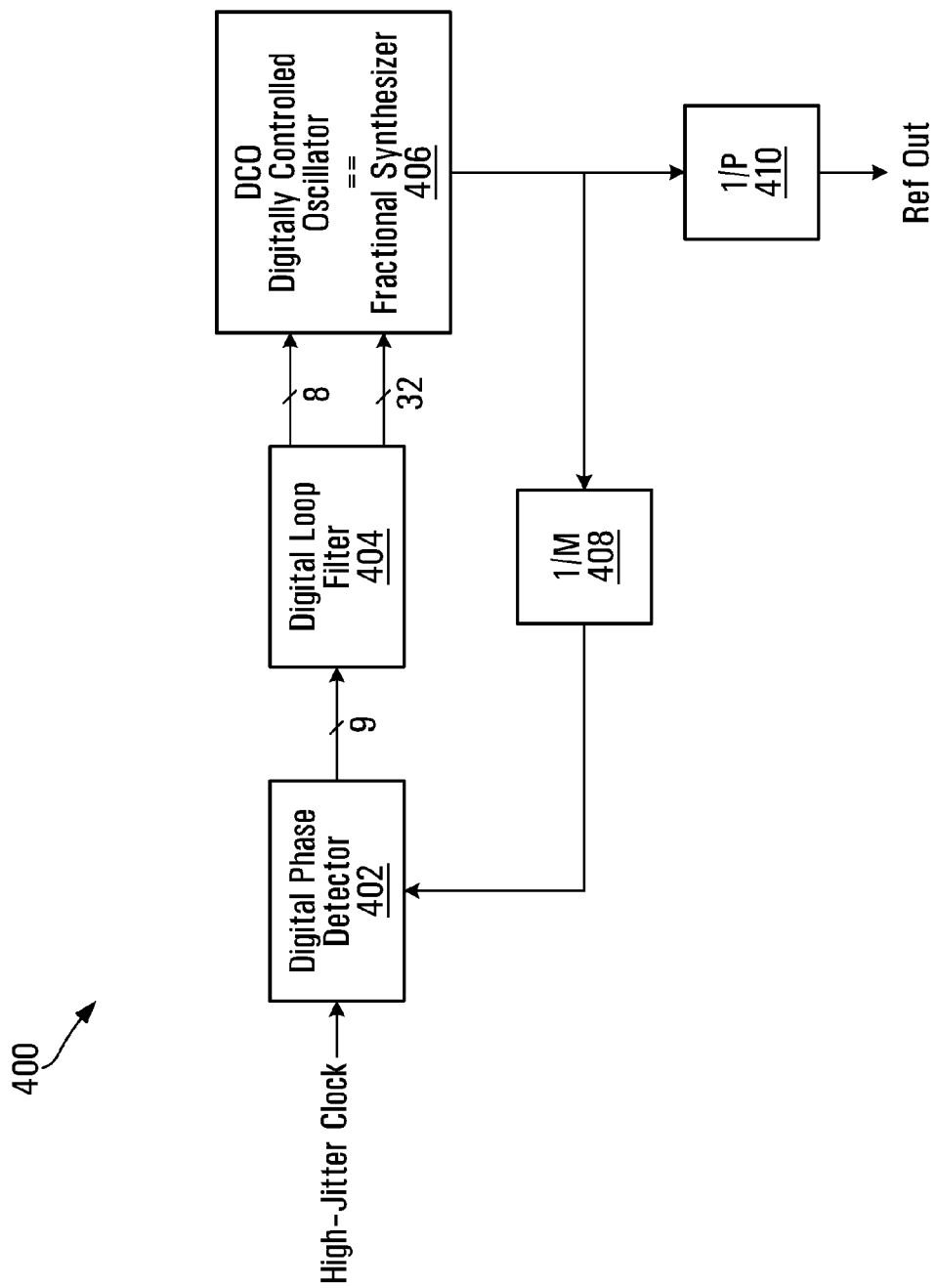
FIG. 4 is a block diagram of another example PLL.

FIG. 4 is a block diagram of another example PLL. The example PLL 400 includes a digital phase detector 402, a digital loop filter 404, a DCO/fractional synthesizer (hereinafter referred to as a "fractional synthesizer") 406, and a divider 408. In the example shown, the PLL 400 is provided with an input reference clock signal from a high jitter clock source, and includes another divider 410 for providing a reference clock output signal at a different frequency. The reference clock output signal might be used as a clock signal for one or more other components, as a reference clock signal for a transmit PLL for instance. The additional divider 410 is an optional component that might not necessarily be provided in every implementation.

The digital phase detector 402 could be implemented in any of various ways. A GRO (Gated Ring Oscillator) is an example of one possible implementation. Resolution of the digital phase detector 402 is 9 bits in the example shown, although other resolutions are also contemplated. Higher resolutions are generally preferred to avoid dead zones and reduce the quantization noise.

Figure 5A:
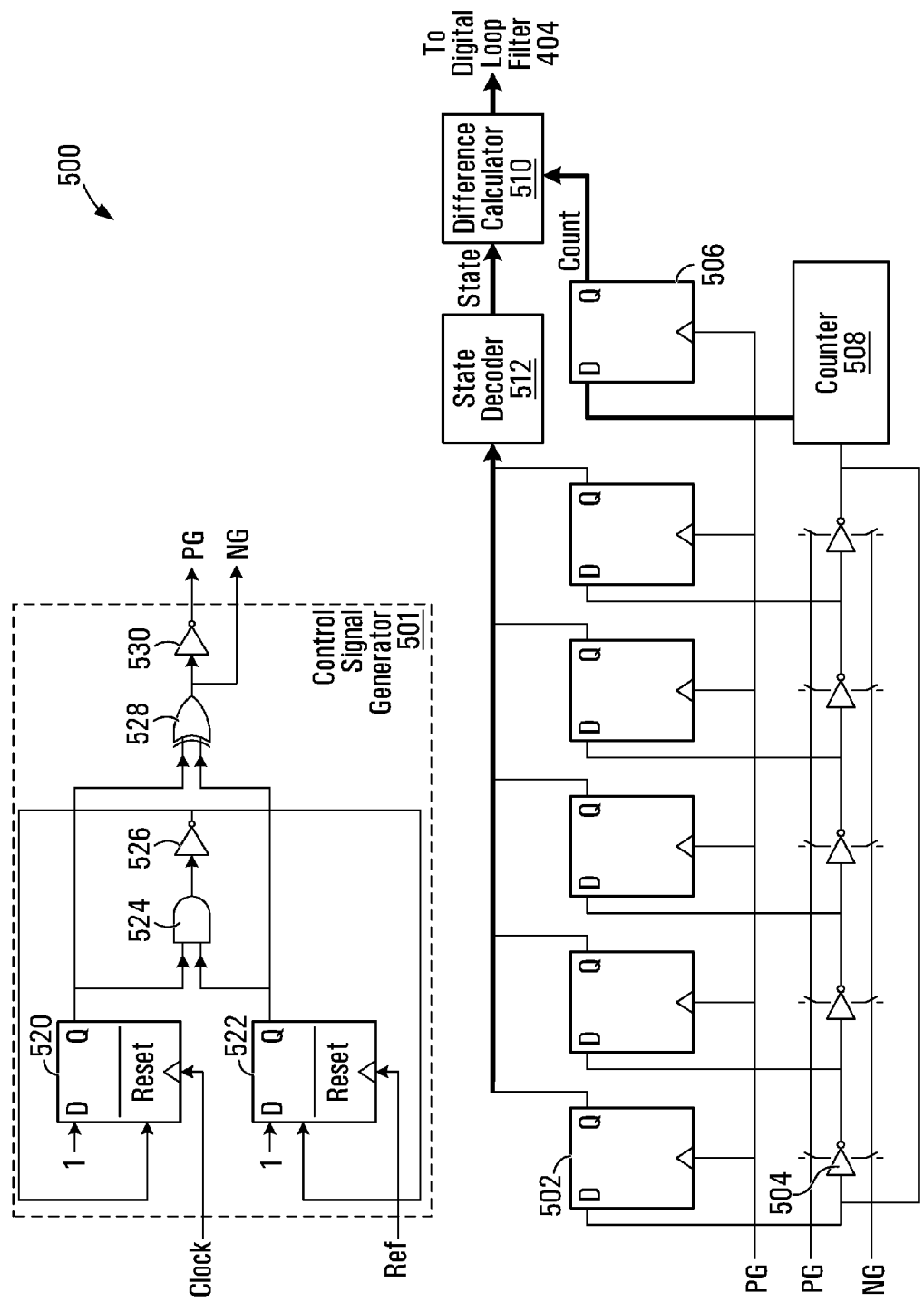
FIG. 5A is a block diagram of an example digital phase detector.

FIG. 5A is a block diagram of an example digital phase detector, in the form of a simplified implementation of a GRO. The GRO 500 as shown in FIG. 5A includes a control signal generator 501, state flip-flops 502, inverters 504, a multi-bit count register 506, a counter 508, a state decoder 512, and a difference calculator 510, and uses the delay of the inverters 504 to quantize the time difference between the reference (Ref) and Clock signal edges. This time difference is representative of the phase difference between the Ref and Clock signals. By wrapping the inverters 504 into a ring oscillator, it is possible to reduce the number of inverters that would otherwise be necessary to measure a large phase difference.

In the example GRO 500, the output of each inverter 504 is the inverse of its input when PG is low (NG is high), and the output holds or latches its last state when PG is high (NG is low). The state decoder 512 decodes the output bits from the flip-flops 502 into 4 bits representative of one of 10 states of the example GRO 500. For a 9-bit digital phase detector implementation with a 4-bit State signal, the count register 508 is a 5-bit register. Other resolutions may be implemented in other embodiments.

The PG and NG control signals are generated by the control signal generator 501 to start and stop the example GRO 500 from running, based on the phase difference between the Ref and Clock signal inputs. The difference in the readings of the State and Count between the start and stop of the running of the GRO represents the phase difference, quantized into units of inverter delay. In the example shown, the phase difference would be calculated as:

$$2*5*(CountEnd-CountStart)+(StateEnd-StateStart),$$

where

CountEnd is the value at the output of the counter 508 when the GRO 500 is stopped,
CountStart is the value at the output of the counter 508 when the GRO is started,
StateEnd is the State value when the GRO is stopped, and
StateStart is the State value when the GRO is started.

This example calculation of quantized phase difference relates to the example GRO 500 as shown in FIG. 5A. The calculation would be different for a GRO that includes a different number of inverters 504, and/or a different GRO structure. The phase difference calculation would also vary for types of digital phase detectors other than a GRO.

The control signal generator 501 in the example GRO 500 includes two flip-flops 520, 522, that receive the Clock and Ref signals, respectively, and AND logic gate 524, an inverter 526, an exclusive OR (XOR) gate 528, and another inverter 530. The flip-flops 520, 522 and the 'AND' gate 524 form an analog phase detector. The XOR gate 528 processes the difference between the flip-flop output signals to create the NG signal, which causes the GRO 500 to run. The PG signal at the output of the inverter 530 is the inverse of the NG signal.

For an implementation of the example GRO 500 as the digital phase detector 402, the high-jitter clock signal is the Ref signal shown in FIG. 5A, and the feedback signal on the feedback path in the example PLL 400 is the Clock signal.

The gain of the example GRO 500, which as noted above represents one possible implementation of a digital phase detector, is based on a the delay of the inverters 504. Generally, this delay could vary by as much as 3:1 across different chips, due to manufacturing tolerances. Having the gain change by this much could affect the bandwidth and stability of a PLL. To address this potential issue, many designs use feedback loops to control the inverter delay. This has the effect of making the delay longer, which increases the quantization noise of the digital phase detector.

Since the loop filter 404 (FIG. 4) is a digital loop filter, it is possible to compensate for variations in the digital phase detector gain by applying a correction gain at the loop filter input or the digital phase detector output. In order to determine this correction gain, a GRO could be used to measure the period of a reference signal that has a known frequency. This known frequency reference signal could be the reference signal for the fractional synthesizer phase detector, which is described below with reference to FIG. 10, although it could be any signal having a known frequency. The quantized measurement of the period of the known frequency reference signal can then be compared with an expected value of the measurement, since the frequency of the reference signal is known, to create a correction factor that can be used to adjust a gain of the loop filter.

FIG. 5B is a block diagram of an example inverter delay calibration system, which enables calibration of inverter delay and correction for resultant variance in gain of a GRO-based digital phase detector. The example calibration system 550 includes a control signal generator that runs a GRO 556 for the period of the reference clock signal Ref. The control signal generator includes a flip-flop 552 followed by an inverter 554, and generates the PG and NG control signals for the GRO 556. The difference calculator 558 calculates a quantized period of the known frequency reference signal Ref. Where the example calibration system 550 is intended to calibrate inverter delay for the example GRO 500 (FIG. 5A), the difference calculator 558 calculates the quantized period as:

$$2*5*(CountEnd-CountStart)+(StateEnd-StateStart),$$

where the terms in the calculation are as described above. This calculation applies to the specific example GRO 500 as shown in FIG. 5A, and would be different for other GROs.

The quantized period may be filtered by an optional lowpass filter 560 in some embodiments, and is used to calculate a correction factor. In the example shown, a correction factor calculator in the form of a divider 562 calculates the correction factor as:

(expected period measurement/actual period measurement).

The calculated correction factor may be filtered by another optional lowpass filter 564 in some embodiments.

The GRO 556 could be a copy of the example GRO 500 (FIG. 5A), not including the control signal generator 501. The example calibration system 550 could also or instead calibrate inverter delay in the actual GRO that is used in a digital phase detector. For example, a period measurement for inverter delay calibration on a digital phase detector GRO or a copy of the GRO could be performed at startup, and a fixed value of the resultant correction factor could then be used during subsequent phase measurement. Calibration could also be performed periodically. There are many types of interleaving that could be implemented where the same GRO is used for both calibration and phase measurement. Calibration and phase measurement could be ongoing parallel processes where a copy of a digital phase detector GRO is provided for calibration.

Another possible option would be to provide two identical GROs alternating between phase measurement and calibration. The calibration factors determined by the two GROs could then be used to determine an overall correction factor for loop filter gain adjustment. The overall correction factor could be an average or other combination of the two calibration factors, for example.

Generally, variances in inverter delays on a single chip tend to be much smaller than those between inverters on different chips. Therefore calibration of inverter delay on a copy of a digital phase detector GRO could avoid interleaving complexity where the digital phase detector GRO and the copy are integrated into the same chip, for example.

Similar to the digital phase detector 402, the digital loop filter 404 could be implemented in any of various ways. The bandwidth of the digital loop filter 404 is determined by its coefficients. Generally a lower bandwidth filter will require more bits to be able to represent the signal properly, so in effect a lower bandwidth filter requires more bits. In the example shown, the digital loop filter 404 has 9 input bits and 40 output bits. Other numbers of input and/or output bits could be provided. The digital loop filter 404 could potentially have dynamic bandwidth, to allow the example PLL 400 to initially lock faster (high bandwidth) and then switch to a lower bandwidth to reduce noise.

The digital loop filter 404 could be implemented, for example, as a simple cascade of first order leaky integrators. More complex filters might offer slightly better performance, but at the cost of complexity. FIG. 6 is a block diagram of an example digital loop filter. The example digital loop filter 600 includes a multiplier 602 to set the gain, an optional multiplier 604 to adjust the gain based on a calibration factor, and an integrator with a zero 606, followed by one or more lowpass filter sections 608. Any number (n) of lowpass filter sections 606 could be used. The lowpass filter section(s) 606 could also be implemented as a more complex multi-order filter. The calibration factor provided to the multiplier 604 could be generated by a calibration system such as the example calibration system 550 shown in FIG. 5B. Although FIG. 6 shows the components 602, 604, 606, 608 in a serial path in this order, the order of these components could be different in other embodiments.

Figure 7:
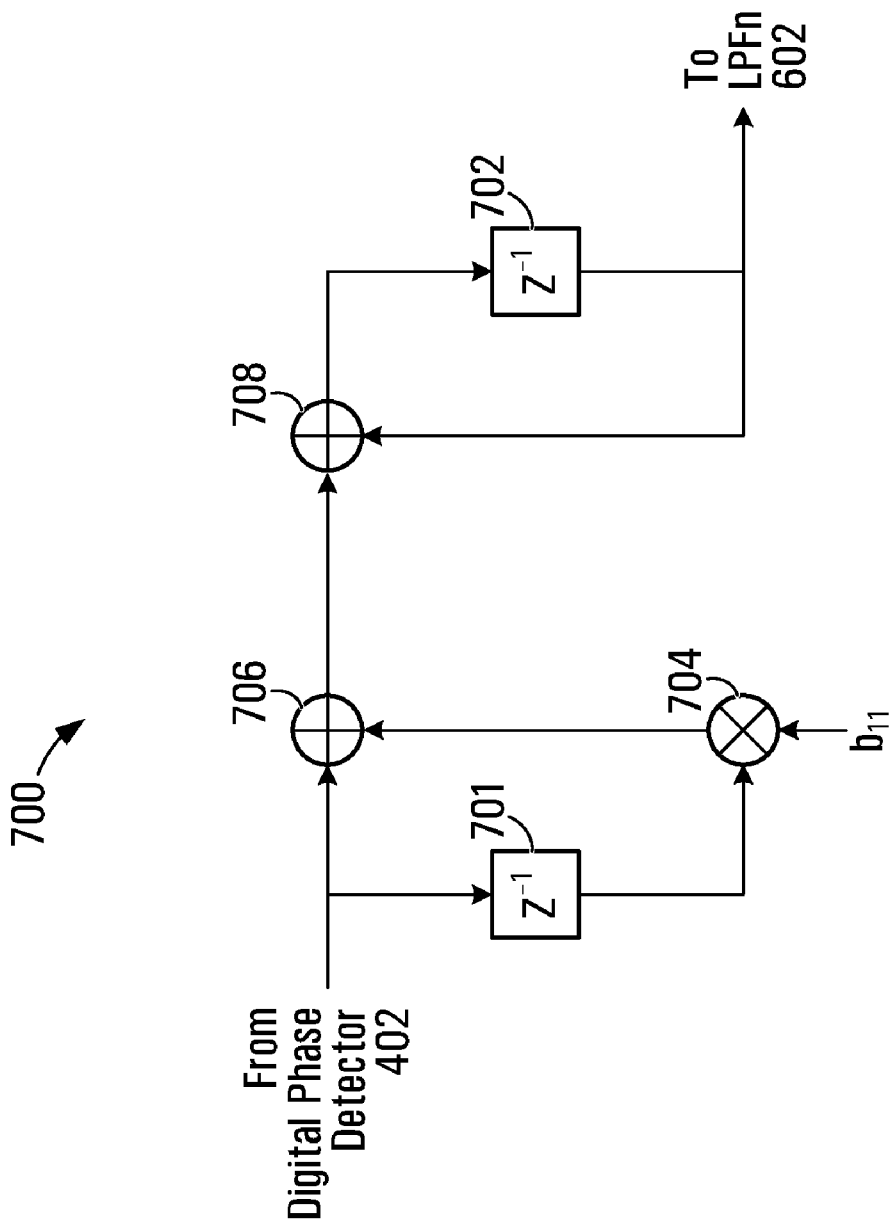
FIG. 7 is a block diagram of an example integrator with zero.
Figure 8:
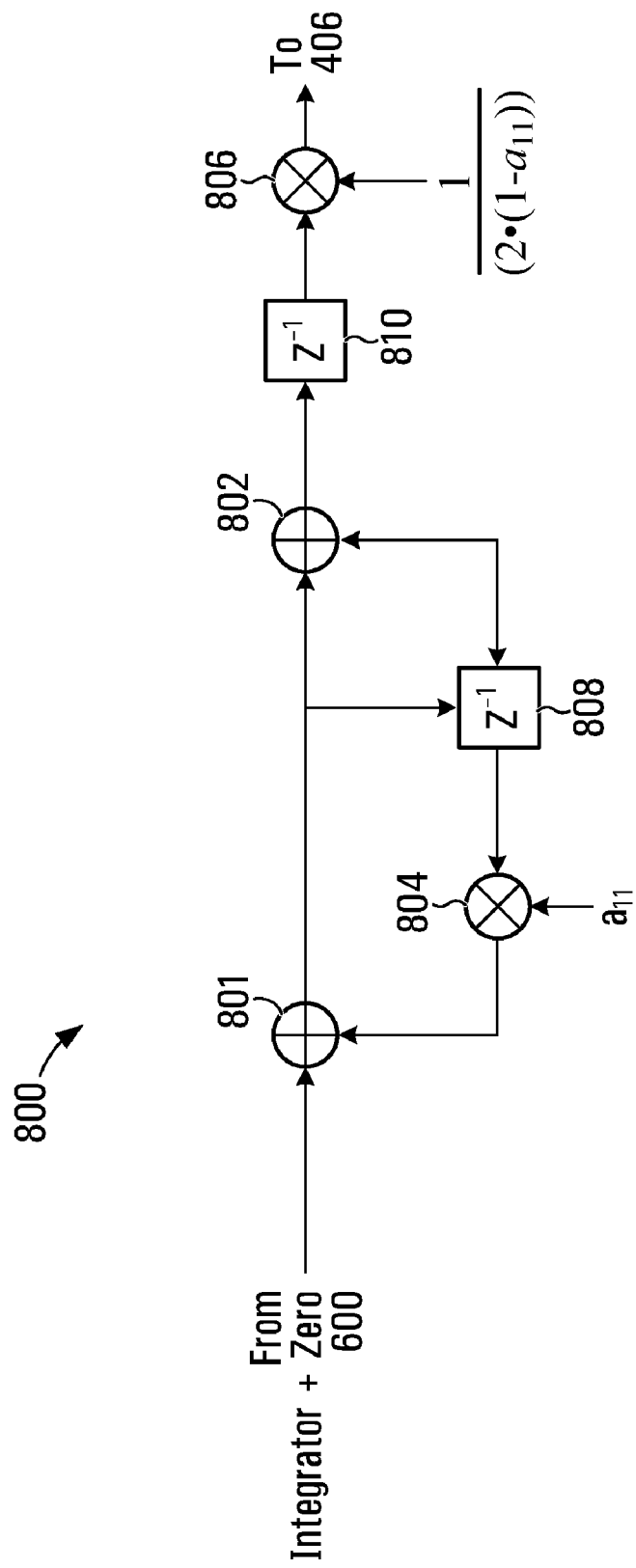
FIG. 8 is a block diagram of an example digital lowpass filter section.

FIG. 7 is a block diagram of an example integrator with zero 700, which includes unit delays 701, 702, a multiplier 704, and adders 706, 708. FIG. 8 is a block diagram of an example digital lowpass filter section 800, which includes adders 801, 802, multipliers 804, 806, and unit delays 808, 810. The filter coefficients $a_{11}$ and $b_{11}$ affect the bandwidth of the example loop filter, and either or both of these coefficients could be fixed or variable. Dynamic bandwidth switching as noted above could be provided by initially setting $a_{11}$ and $b_{11}$ for high bandwidth and faster PLL locking, and then changing one or both of $a_{11}$ and $b_{11}$ to switch to a lower bandwidth to reduce noise.

With reference again to FIG. 4, the divider 408, and the divider 410 if implemented in conjunction with a PLL, are also open to any of various possible designs. The divider 408, for example, could be implemented with a fixed modulus M or as a fractional divider.

Figure 9:
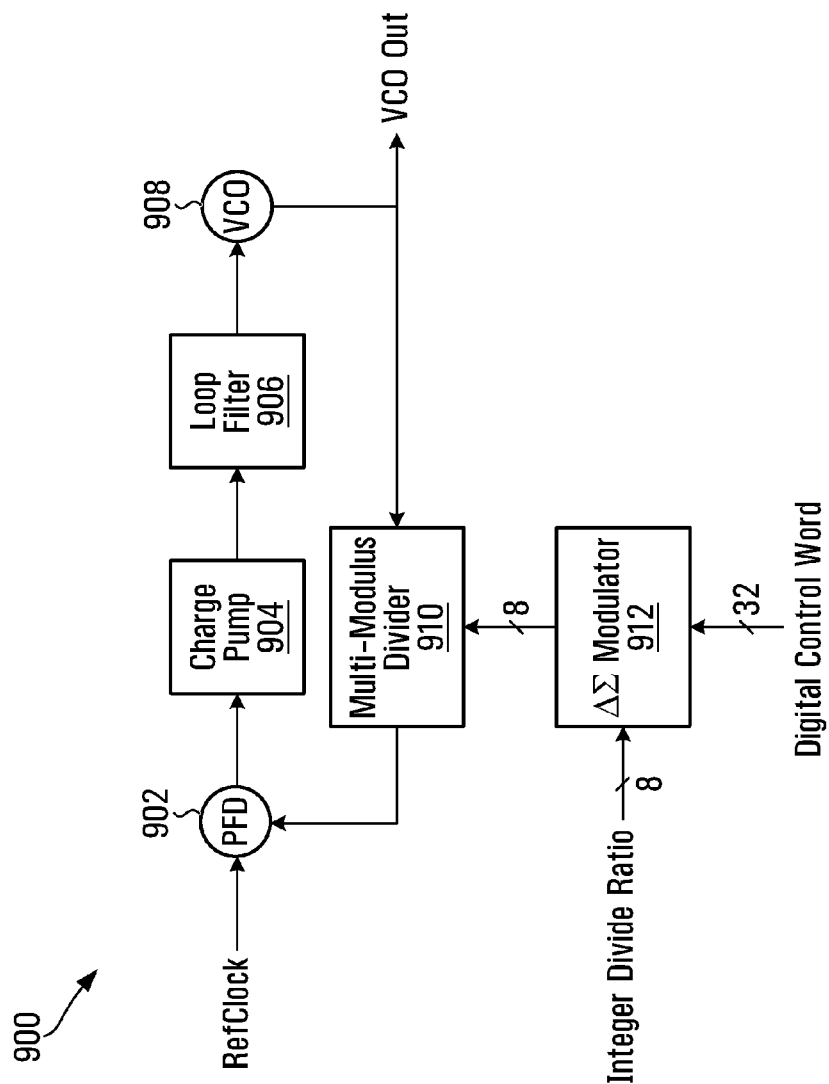
FIG. 9 is a block diagram of an example fractional synthesizer.

An example of the fractional synthesizer 406 is shown in block diagram form in FIG. 9. The example fractional synthesizer 900 includes a phase detector 902, a charge pump 904, a loop filter 906, a VCO 908, a multi-modulus divider 910, and a delta-sigma modulator 912. The phase detector 902, the charge pump 904, the loop filter 906, the VCO 908, and the multi-modulus divider 910 are operatively coupled together to form a fractional N PLL circuit, in which the modulus of the multi-modulus divider 910 is variable, to effectively provide a fractional division factor.

The delta-sigma modulator 912 in the example fractional synthesizer 900 has two inputs, which are shown as an 8-bit integer divide ratio, and a 32-bit digital control word. These inputs are provided to the delta-sigma modulator 912 by the digital filter 404 (FIG. 4) in this example. An 8-bit control signal for controlling the modulus of the multi-modulus divider 910 is generated by the delta-sigma modulator 912 based on the integer divide ratio and the digital control word. Other implementations could use different numbers of input bits and/or output bits in a delta-sigma modulator.

There are many possible implementations of a delta-sigma modulator. In general, a delta-sigma modulator takes a high resolution digital word and quantizes it into a much smaller number of bits. In the example fractional synthesizer 900, the delta-sigma modulator 912 converts the integer and fractional divide ratio into a stream of integer division factors. The nature of the pattern of the integer division factors determines the power spectral density of the output of the multi-modulus divider 910. In some embodiments, the delta-sigma modulator 912 pushes quantization noise of the multi-modulus divider 910 to higher frequencies. This quantization noise is then removed by the loop filter 906.

Figure 10:
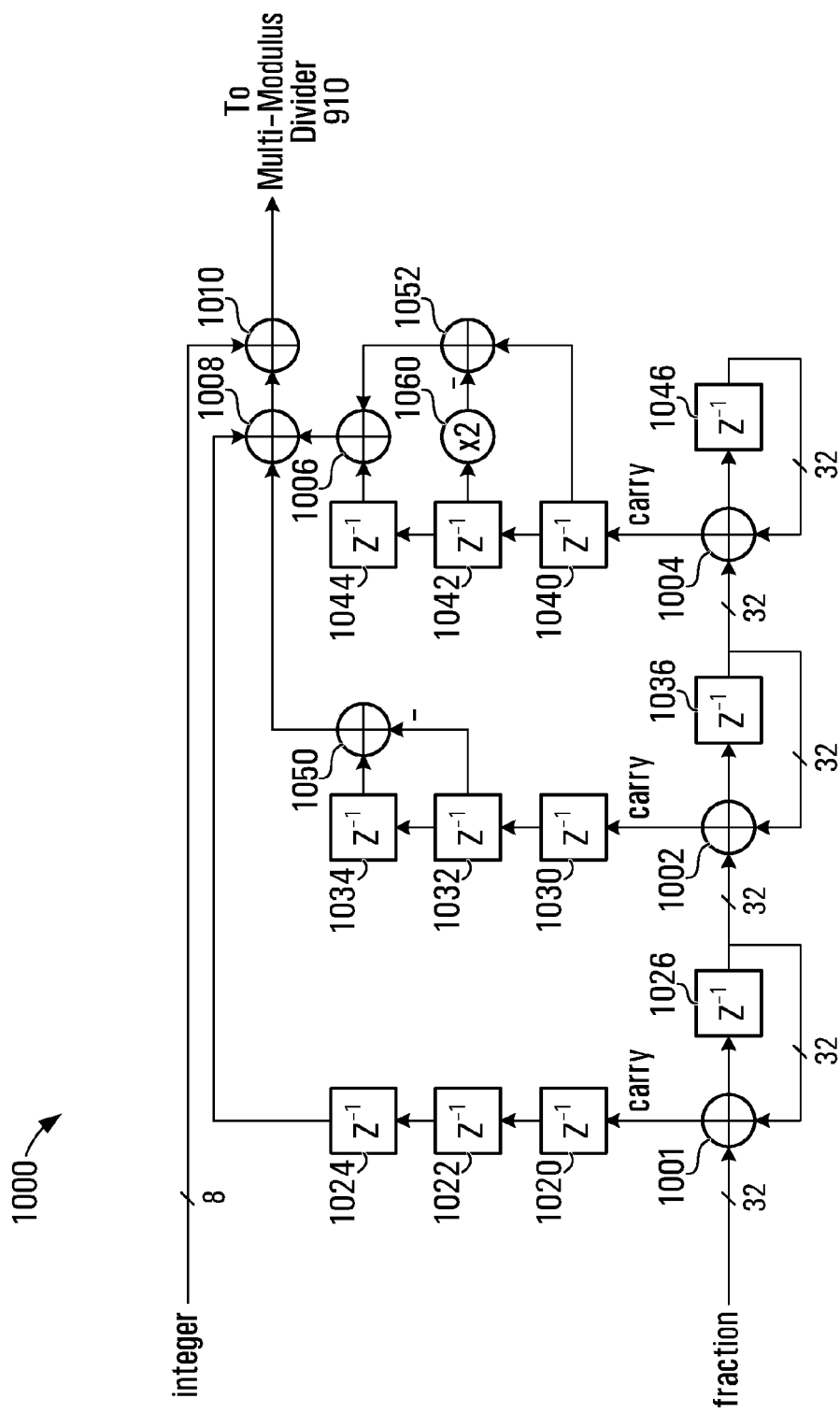
FIG. 10 is a block diagram of an example delta-sigma modulator.

FIG. 10 is a block diagram of an example delta-sigma modulator, in the form of a multi-stage noise shaping (MASH) modulator. The example delta-sigma modulator 1000 includes adders 1001, 1002, 1004, 1006, 1008, 1010, unit delays 1020, 1022, 1024, 1026, 1030, 1032, 1034, 1036, 1040, 1042, 1044, 1046, adders 1050, 1052 with one inverted input, and a multiplier 1060.

Figure 11:
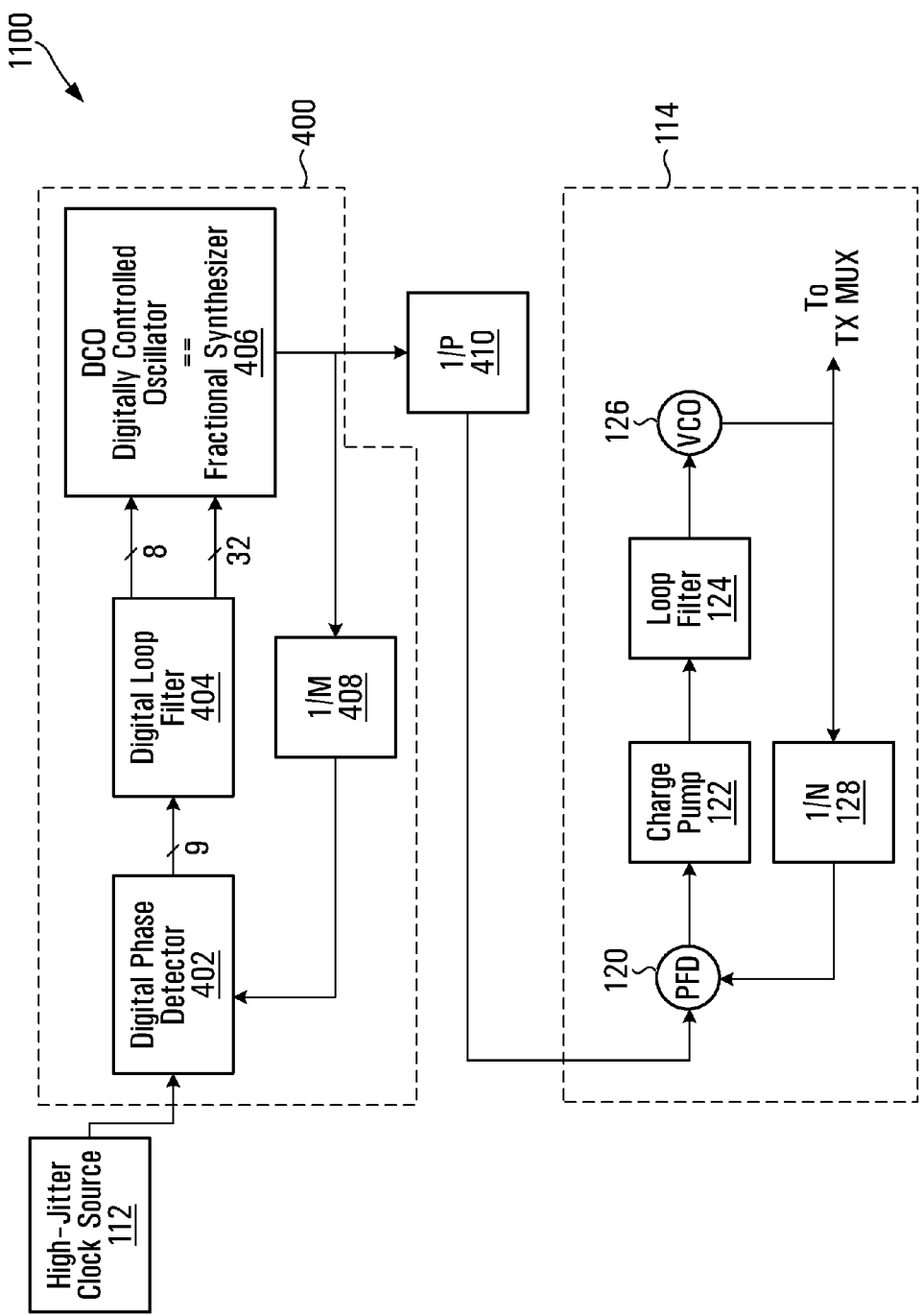
FIG. 11 is a block diagram of an example PLL system including a cleanup PLL and a transmit PLL.
Figure 12:
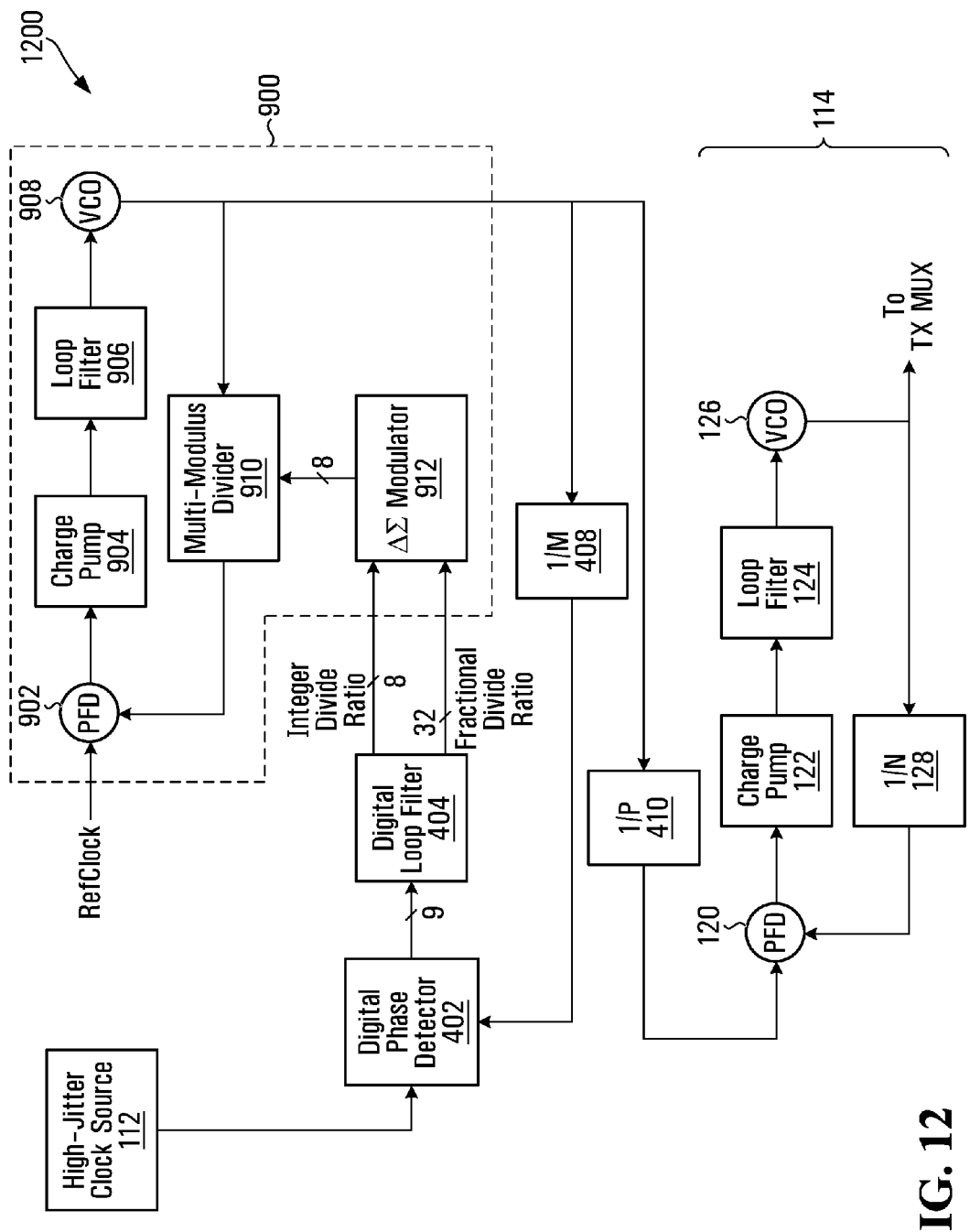
FIG. 12 is a block diagram of an example PLL system of the type shown in FIG. 11 including the example fractional synthesizer of FIG. 9.

Referring again to FIG. 9, although the PLL circuit portion of the example fractional synthesizer 900 might appear to be similar to a classical PLL design, the delta-sigma modulator 912 is driven by a digitally filtered phase detection signal from a digital phase detector which is part of another PLL circuit, as will become apparent from FIGS. 11 and 12.

FIG. 11 is a block diagram of an example PLL system 1100 including a cleanup PLL in the form of the example PLL 400 (FIG. 4) and a transmit PLL 114. In this example PLL system 1100, the divider 410 is coupled to divide the frequency of the output of the example PLL 400 and to provide a lower frequency reference clock signal to the phase detector 120 of the transmit PLL 114.

FIG. 12 is a block diagram of an example PLL system 1200 of the type shown in FIG. 11, including the example fractional synthesizer 900 (FIG. 9) in the cleanup PLL stage, with its own clean reference clock signal RefClock, which as noted above could potentially also be used as a known frequency reference signal for inverter delay calibration. From FIG. 12, it will be apparent that the delta-sigma modulator 912 is driven by the output of the digital loop filter 404, which is a filtered version of the phase detection signal generated by the digital phase detector 402. The delta sigma modulator 912 thus controls the modulus of the multi-modulus divider 910 in one PLL circuit based on a filtered phase detection signal from a different PLL circuit. The output signal from the VCO 908 is an output of the cleanup PLL circuit in the example shown, and is also used to generate a feedback signal to both the phase detector 902 and the digital phase detector 402.

Figure 13:
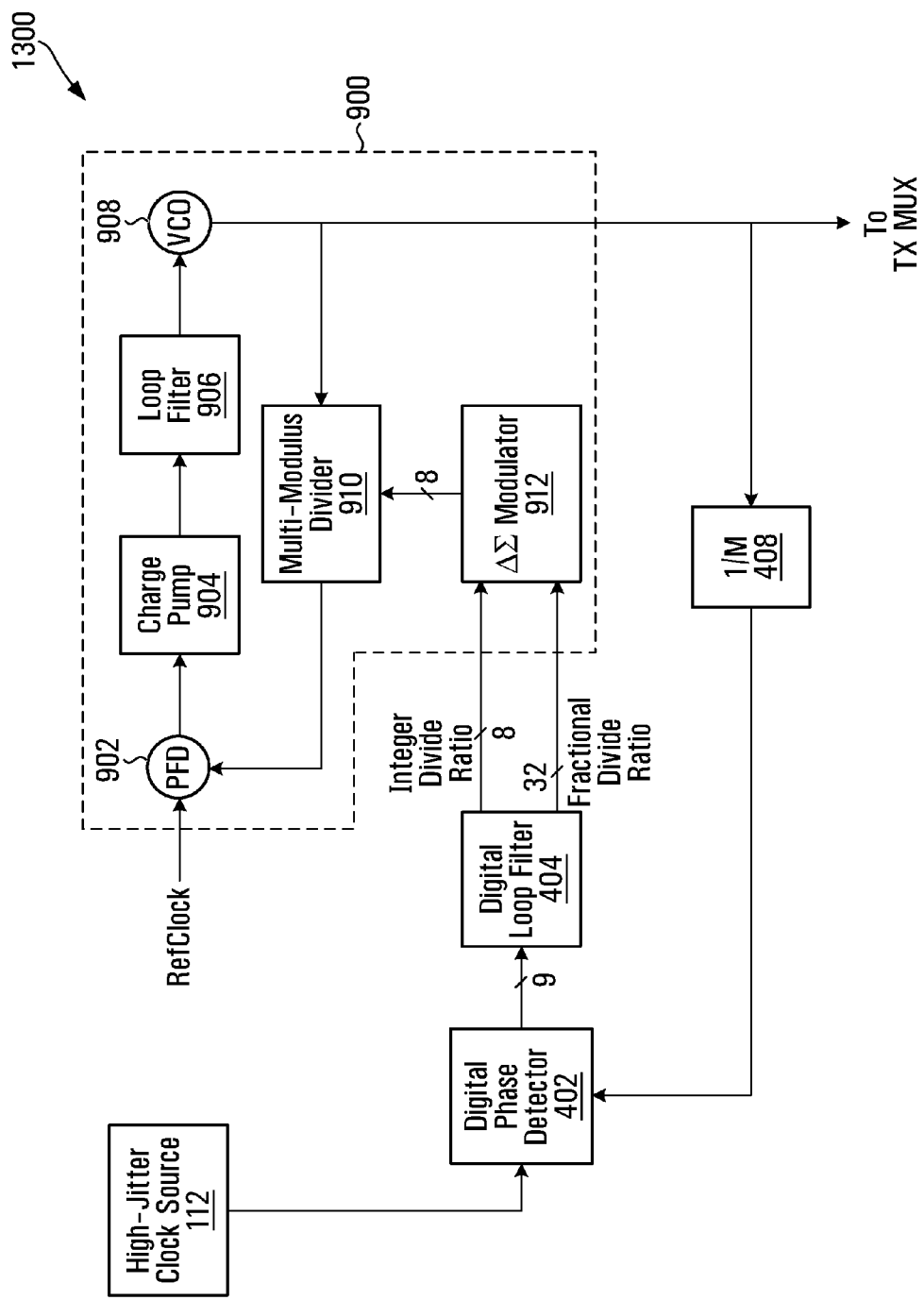
FIG. 13 is a block diagram of another example PLL including the example fractional synthesizer of FIG. 9.

FIG. 13 is a block diagram of another example PLL 1300 including the example fractional synthesizer 900 of FIG. 9. From a review of FIGS. 11 and 12, for example, it should be apparent that the example PLL systems 1100, 1200 include multiple PLL-type circuits 400, 900, 114. The example PLL 1300 combines the cleanup PLL 400, including the example fractional synthesizer 900, with the transmit PLL 114. Instead of providing separate analog PLL circuits in both the example fractional synthesizer 900 and the transmit PLL 114 as shown in FIG. 12, the example PLL circuit 1300 includes a single PLL circuit for both purposes. Although the divider 408 is shown in FIG. 13, depending on the frequency of the PLL circuit output signal, the modulus of the divider 408 could be different in the example PLL circuit 1300 than the modulus M in other examples.

Referring generally to FIGS. 11 through 13, the example PLL systems 1100, 1200 and the example PLL 1300 include a circuit in which the digital phase detector 402 is operatively coupled to an input to receive a reference clock signal from the high-jitter clock source 112. The digital loop filter 404 is operatively coupled to the digital phase detector 402 to digitally filter an output of the digital phase detector. The fractional synthesizer 406, 900 is operatively coupled to the digital loop filter 404 to synthesize a PLL output signal under control of an output of the digital loop filter. The feedback path, which may include a divider as shown at 408, is operatively coupled to the fractional synthesizer 406, 900 and to the digital phase detector 402, to provide a feedback signal, based on the PLL output signal, as an input signal for the digital phase detector. The divider 408 generates this feedback signal in the example shown by dividing a frequency of the PLL output signal. However, in other embodiments the PLL output signal could be used as the feedback signal, which would effectively be a unity division factor or could possibly be implemented without a divider 408.

In the example PLL system 1200 and the example PLL 1300, the example fractional synthesizer 900 includes an input to receive a second reference clock signal, and the phase detector 902 is operatively coupled to the input. The loop filter 906 is operatively coupled to the phase detector 902 through the charge pump 904, to filter an output of the phase detector. The VCO 908 is operatively coupled to the loop filter 906 to generate the PLL output signal under control of an output of the loop filter. A fractional N divider, including the multiple-modulus divider 910 and the delta-sigma modulator 912, is operatively coupled to the VCO 908, to the phase detector 902, and to the digital loop filter 404, to generate a feedback signal as an input signal for the phase detector by dividing a frequency of the PLL output signal by a variable modulus.

In the example fractional N divider arrangement, the multiple-modulus divider 910 operatively coupled to the VCO 908 and to the phase detector 902, and the delta-sigma modulator 912 is operatively coupled to the digital loop filter 404. The delta-sigma modulator 912 provides, to the multiple-modulus divider 910, a control signal to control the variable modulus.

The example PLL systems 1100, 1200 and/or the example PLL 1300 could be implemented, for example, in an electronic device such as a communication device or equipment which could include one or more cleanup PLLs, in which oscillators could be run at different frequencies, and/or one or more further PLLs such as the transmit PLL 114. The phase detector 120 in a further PLL could be operatively coupled to the fractional synthesizer 406, 900, and could also include a loop filter 124 operatively coupled to the phase detector (through the charge pump 122 in the examples shown) to filter an output of the phase detector, a VCO 126 operatively coupled to the loop filter to generate an output signal of the further PLL circuit under control of an output of the loop filter; and a feedback path to provide a feedback signal, based on the output signal of the further PLL, as an input signal for the phase detector 120. In the examples shown, the feedback path includes the divider 128 to generate the feedback signal by dividing a frequency of the output signal of the further PLL. A divider 410 could be operatively coupled to the fractional synthesizer 406, 900 and to the phase detector 120, to generate a reference clock signal as an input signal for the phase detector by dividing a frequency of the PLL output signal.

Figure 14:
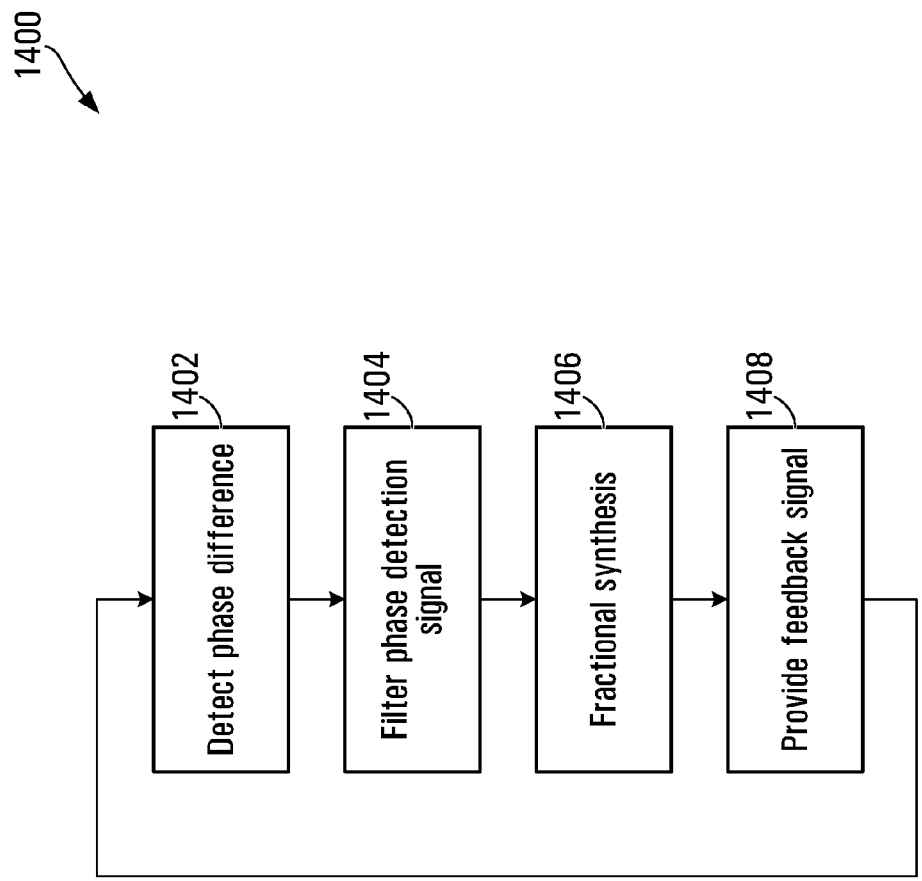
FIG. 14 is a flow diagram of an example method.

FIG. 14 is a flow diagram of an example method. The example method 1400 includes digitally detecting a phase difference between a reference clock signal and a feedback signal to generate a phase detection signal at 1402, digitally filtering the phase detection signal to generate a filtered phase detection signal at 1404, synthesizing an output signal in a fractional synthesizer under control of the filtered phase detection signal at 1406, and generating the feedback signal at 1408.

The example method 1400 is intended solely for illustrative purposes. Variations in the operations performed, and/or the ways in which operations could be performed, may also be or become apparent. At least some possible variations will be evident from the preceding drawings and the description thereof.

What has been described is merely illustrative of the application of principles of example embodiments. Other arrangements and methods can be implemented by those skilled in the art.

For example, the present disclosure does not depend on any particular rate when implemented in communication devices or equipment. Aspects of the present disclosure could similarly be applied to any of various types of communications, including multi-channel communications, SONET, OTN, Ethernet (including SyncE (Synchronous Ethernet)), Fiber Channel, etc. Other implementations outside the field of communications, in electronic devices more generally, are also possible.

In addition, although described primarily in the context of methods and systems, other implementations are also contemplated, as instructions stored on a non-transitory computer-readable medium, for example.

We claim:

1. A PLL (Phase Locked Loop) circuit comprising:
   an input to receive a reference clock signal;
   a digital phase detector operatively coupled to the input;
   a digital loop filter operatively coupled to the digital phase detector to digitally filter an output of the digital phase detector;
   a fractional synthesizer operatively coupled to the digital loop filter to synthesize a PLL output signal under control of an output of the digital loop filter; and
   a feedback path operatively coupled to the fractional synthesizer and to the digital phase detector, to provide a feedback signal, based on the PLL output signal, as an input signal for the digital phase detector,
   the fractional synthesizer comprising:
   an input to receive a second reference clock signal;
   a phase detector operatively coupled to the input;
   a loop filter operatively coupled to the phase detector to filter an output of the phase detector;
   a VCO (Voltage Controlled Oscillator) operatively coupled to the loop filter to generate the PLL output signal under control of an output of the loop filter; and
   a fractional N divider operatively coupled to the VCO, to the phase detector, and to the digital loop filter, to generate a feedback signal as an input signal for the phase detector by dividing a frequency of the PLL output signal by a variable modulus.

2. The PLL circuit of claim 1, the feedback path comprising:
   a divider operatively coupled to the fractional synthesizer and to the digital phase detector, to generate the feedback signal by dividing a frequency of the PLL output signal.

3. The PLL circuit of claim 1, the fractional N divider comprising:
   a multiple-modulus divider operatively coupled to the VCO and to the phase detector; and
   a delta-sigma modulator operatively coupled to the digital loop filter, to provide to the multiple-modulus divider a control signal to control the variable modulus.

4. A PLL (Phase Locked Loop) circuit comprising:
   an input to receive a reference clock signal;
   a digital phase detector operatively coupled to the input;
   a digital loop filter operatively coupled to the digital phase detector to digitally filter an output of the digital phase detector;
   a fractional synthesizer operatively coupled to the digital loop filter to synthesize a PLL output signal under control of an output of the digital loop filter; and
   a feedback path operatively coupled to the fractional synthesizer and to the digital phase detector, to provide a feedback signal, based on the PLL output signal, as an input signal for the digital phase detector,
   the digital phase detector comprising:
   a GRO (Gated Ring Oscillator) comprising inverters;
   a control signal generator operatively coupled to the GRO, to provide control signals based on the reference clock signal and the feedback signal to start and stop the GRO; and
   a difference calculator operatively coupled to the GRO to calculate a phase difference between the reference clock signal and the feedback signal quantized into units of inverter delay of the inverters,
   the PLL circuit further comprising:
   an inverter delay calibration system to calibrate the inverter delay and to generate a gain correction factor for the digital loop filter based on calibration of the inverter delay.

5. The PLL circuit of claim 4, the inverter delay calibration system comprising:
   an inverter delay calibration system GRO comprising inverters;
   an inverter delay calibration system control signal generator operatively coupled to the inverter delay calibration system GRO, to provide control signals based on a known frequency reference clock signal to run the inverter delay calibration system GRO during a period of the known frequency reference signal;
   an inverter delay calibration system difference calculator operatively coupled to the inverter delay calibration system GRO to calculate the period of the known frequency reference signal quantized into units of inverter delay of the inverters of the inverter delay calibration system GRO; and
   an inverter delay calibration system correction factor calculator operatively coupled to the inverter delay calibration system difference calculator to calculate the gain correction factor based on an actual period of the known frequency reference signal and the calculated period of the known frequency reference signal.

6. The PLL circuit of claim 5, the GRO of the digital phase detector and the inverter delay calibration system GRO comprising a single GRO.

7. An electronic device comprising:
   a cleanup PLL (Phase Locked Loop) circuit comprising:
   an input to receive a reference clock signal;

a digital phase detector operatively coupled to the input;
a digital loop filter operatively coupled to the digital phase detector to digitally filter an output of the digital phase detector;
a fractional synthesizer operatively coupled to the digital loop filter to synthesize a PLL output signal under control of an output of the digital loop filter; and
a feedback path operatively coupled to the fractional synthesizer and to the digital phase detector, to provide a feedback signal, based on the PLL output signal, as an input signal for the digital phase detector; and
a further PLL circuit comprising:
a phase detector operatively coupled to the fractional synthesizer;
a loop filter operatively coupled to the phase detector to filter an output of the phase detector;
a VCO (Voltage Controlled Oscillator) operatively coupled to the loop filter to generate an output signal of the further PLL circuit under control of an output of the loop filter; and
a feedback path operatively coupled to the VCO and to the loop filter, to provide a feedback signal, based on the output signal of the further PLL circuit, as an input signal for the phase detector.

8. The electronic device of claim 7, the feedback path of the further PLL comprising:
a divider operatively coupled to the VCO and to the loop filter, to generate the feedback signal as the input signal for the phase detector by dividing a frequency of the output signal of the further PLL circuit.

9. The electronic device of claim 7, further comprising:
a divider operatively coupled to the fractional synthesizer and to the phase detector, to generate a reference clock signal as an input signal for the phase detector by dividing a frequency of the PLL output signal.

10. A method comprising:
digitally detecting a phase difference between a reference clock signal and a feedback signal to generate a phase detection signal;
digitally filtering the phase detection signal to generate a filtered phase detection signal;
synthesizing an output signal in a fractional synthesizer under control of the filtered phase detection signal; and
providing the feedback signal based on the output signal, the synthesizing comprising:
detecting a phase difference between a second reference clock signal and a second feedback signal to generate a second phase detection signal;
filtering the second phase detection signal to generate a second filtered phase detection signal;
controlling a VCO (Voltage Controlled Oscillator) with the second filtered phase detection signal to generate the output signal; and
dividing a frequency of the output signal by a variable modulus to generate the second feedback signal.

11. The method of claim 10, the providing comprising:
dividing a frequency of the output signal to generate the feedback signal.

12. The method of claim 10, further comprising:
delta-sigma modulating the filtered phase detection signal to generate a control signal to control the variable modulus.

13. A method comprising:
digitally detecting a phase difference between a reference clock signal and a feedback signal to generate a phase detection signal;
digitally filtering the phase detection signal to generate a filtered phase detection signal;
synthesizing an output signal in a fractional synthesizer under control of the filtered phase detection signal; and
providing the feedback signal based on the output signal, the digitally detecting comprising:
providing, to a GRO (Gated Ring Oscillator) comprising inverters, control signals based on the reference clock signal and the feedback signal to start and stop the GRO; and
calculating a phase difference between the reference clock signal and the feedback signal quantized into units of inverter delay of the inverters,
the method further comprising:
calibrating the inverter delay; and
generating a gain correction factor for the digitally filtering based on calibration of the inverter delay.

14. The method of claim 13, the calibrating comprising:
providing, to an inverter delay calibration system GRO comprising inverters, control signals based on a known frequency reference clock signal to run the inverter delay calibration system GRO during a period of the known frequency reference signal; and
calculating the period of the known frequency reference signal quantized into units of inverter delay of the inverters of the inverter delay calibration system GRO,
the generating comprising:
calculating the gain correction factor based on an actual period of the known frequency reference signal and the calculated period of the known frequency reference signal.

15. The method of claim 14, the GRO and the inverter delay calibration system GRO comprising a single GRO.

16. A method comprising:
digitally detecting a phase difference between a reference clock signal and a feedback signal to generate a phase detection signal;
digitally filtering the phase detection signal to generate a filtered phase detection signal;
synthesizing an output signal in a fractional synthesizer under control of the filtered phase detection signal;
providing the feedback signal based on the output signal;
detecting a phase difference between a further reference clock signal based on the output signal and a further feedback signal to generate a further phase detection signal;
filtering the further phase detection signal to generate a further filtered phase detection signal;
controlling a VCO Voltage Controlled Oscillator (Voltage Controlled Oscillator) with the further filtered phase detection signal to generate a further output signal; and
providing the further feedback signal based on the further output signal.

17. The method of claim 16, the providing comprising:
dividing a frequency of the further output signal to generate the further feedback signal.

18. The method of claim 16, further comprising:
dividing a frequency of the further output signal to generate the further reference clock signal.

19. An apparatus comprising:
means for digitally detecting a phase difference between a reference clock signal and a feedback signal to generate a phase detection signal;
means for digitally filtering the phase detection signal to generate a filtered phase detection signal;

means for synthesizing an output signal in a fractional synthesizer under control of the filtered phase detection signal; and means for providing the further feedback signal based on the further output signal, the means for synthesizing comprising:

means for detecting a phase difference between a second reference clock signal and a second feedback signal to generate a second phase detection signal;

means for filtering the second phase detection signal to generate a second filtered phase detection signal;

means for controlling a VCO (Voltage Controlled Oscillator) with the second filtered phase detection signal to generate the output signal; and means for dividing a frequency of the output signal by a variable modulus to generate the second feedback signal.

20. The apparatus of claim 19, the means for providing comprising:

means for dividing a frequency of the output signal to generate the feedback signal.

21. An apparatus comprising:

means for digitally detecting a phase difference between a reference clock signal and a feedback signal to generate a phase detection signal;

means for digitally filtering the phase detection signal to generate a filtered phase detection signal;

means for synthesizing an output signal in a fractional synthesizer under control of the filtered phase detection signal; and means for providing the further feedback signal based on the further output signal, the means for digitally detecting comprising:

means for quantizing the phase difference in units of inverter delay of inverters in a GRO (Gated Ring Oscillator); and means for calibrating the inverter delay; and means for generating a gain correction factor for the means for digitally filtering, based on calibration of the inverter delay.

\* \* \* \* \*

UNITED STATES PATENT AND TRADEMARK OFFICE
CERTIFICATE OF CORRECTION

PATENT NO. : 8,384,452 B1
APPLICATION NO. : 13/231798
DATED : February 26, 2013
INVENTOR(S) : Kevin Parker et al.

It is certified that error appears in the above-identified patent and that said Letters Patent is hereby corrected as shown below:

In the Claims:

Column 12, claim 16, lines 51-52, "...VCO Voltage Controlled Oscillator (Voltage Controlled Oscillator)..." should be --...VCO (Voltage Controlled Oscillator)...--.

Signed and Sealed this
Thirteenth Day of August, 2013

Teresa Stanek Rea
*Acting Director of the United States Patent and Trademark Office*